(12) United States Patent
Kim et al.

(10) Patent No.: US 9,224,723 B2
(45) Date of Patent: Dec. 29, 2015

(54) SEMICONDUCTOR DEVICE

(71) Applicant: SK hynix Inc., Icheon-si Gyeonggi-do (KR)

(72) Inventors: Tae Kyung Kim, Cheongju-si (KR); Tae Gyun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 53 days.

(21) Appl. No.: 14/183,092

(22) Filed: Feb. 18, 2014

(65) Prior Publication Data
US 2015/0084115 A1 Mar. 26, 2015

(30) Foreign Application Priority Data

Sep. 25, 2013 (KR) .................. 10-2013-0113831

(51) Int. Cl.
| | | |
|---|---|---|
| *H01L 27/115* | (2006.01) | |
| *H01L 27/02* | (2006.01) | |
| *H01L 29/788* | (2006.01) | |
| *H01L 29/792* | (2006.01) | |

(52) U.S. Cl.
CPC ........ *H01L 27/0207* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01); *H01L 29/7889* (2013.01); *H01L 29/7926* (2013.01)

(58) Field of Classification Search
CPC .................. H01L 27/11565; H01L 27/10802; H01L 29/7926; H01L 29/7889
See application file for complete search history.

(56) References Cited

U.S. PATENT DOCUMENTS

| | | | | |
|---|---|---|---|---|
| 2011/0310670 | A1* | 12/2011 | Shim et al. ............... | 365/185.17 |
| 2013/0294168 | A1* | 11/2013 | Shirakawa ............... | 365/185.17 |
| 2014/0073099 | A1* | 3/2014 | Park et al. ..................... | 438/268 |
| 2014/0097484 | A1* | 4/2014 | Seol et al. ..................... | 257/324 |

FOREIGN PATENT DOCUMENTS

| | | |
|---|---|---|
| KR | 1020100091900 A | 8/2010 |
| KR | 101076184 B1 | 10/2011 |
| KR | 1020110128717 A | 11/2011 |

* cited by examiner

*Primary Examiner* — Thomas L Dickey
(74) *Attorney, Agent, or Firm* — William Park & Associates Ltd.

(57) ABSTRACT

Provided is a semiconductor device including a plurality of pillar columns, each of the plurality of pillar columns including a plurality of pillars arranged in one direction to be offset from each other, wherein an mth pillar and an (m+1)th pillar, among the plurality of pillars included in each pillar column, are aligned with each other (m is an integer of 0 or more).

10 Claims, 14 Drawing Sheets

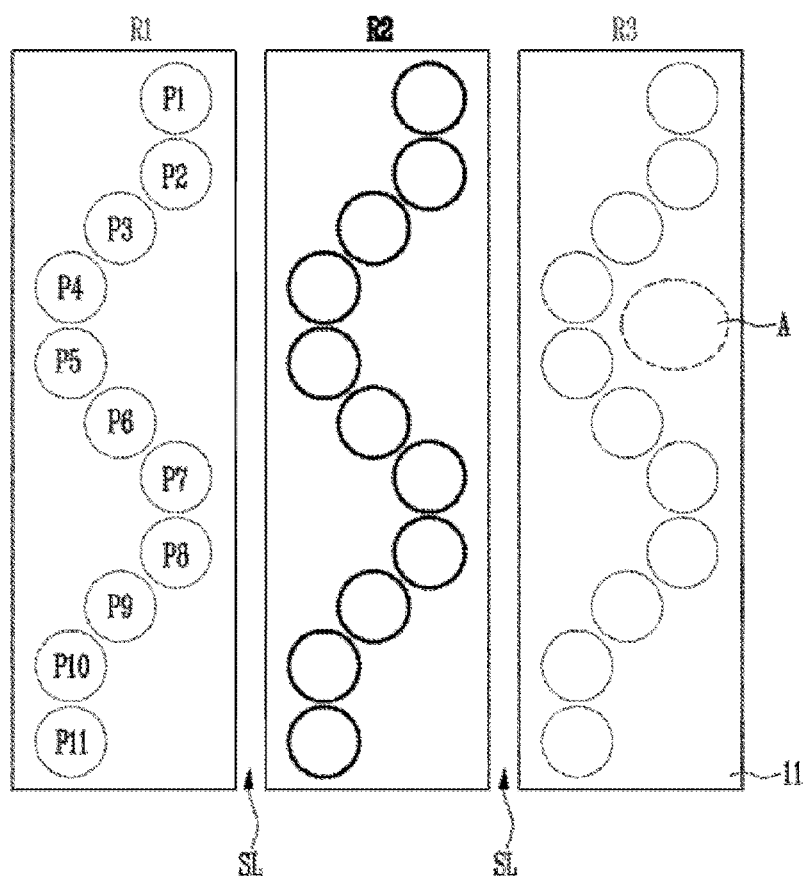

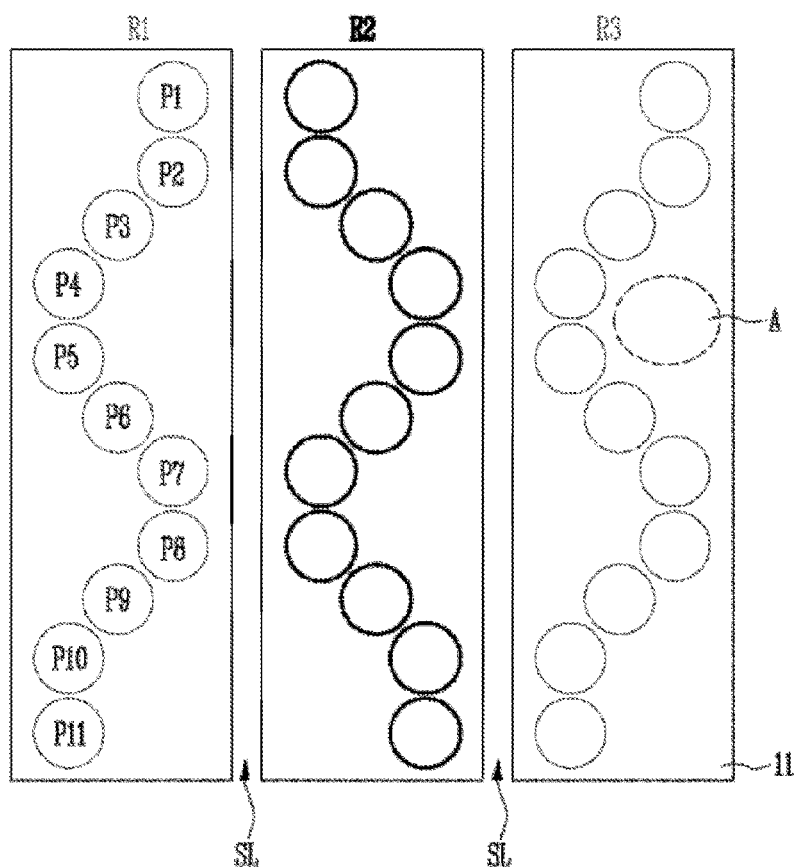

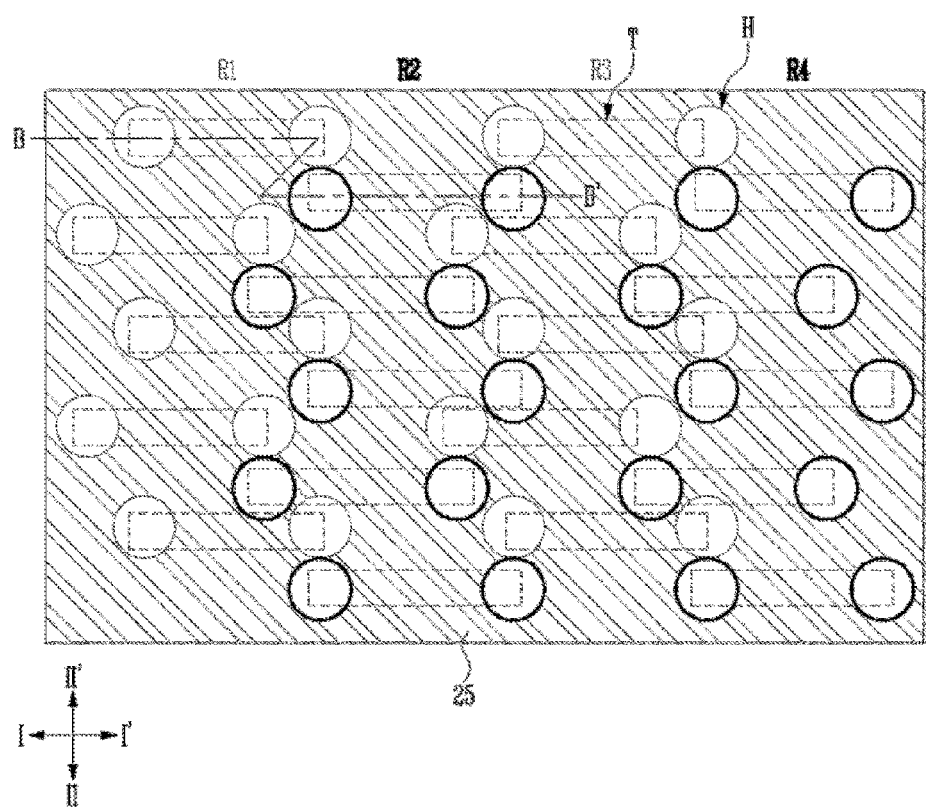

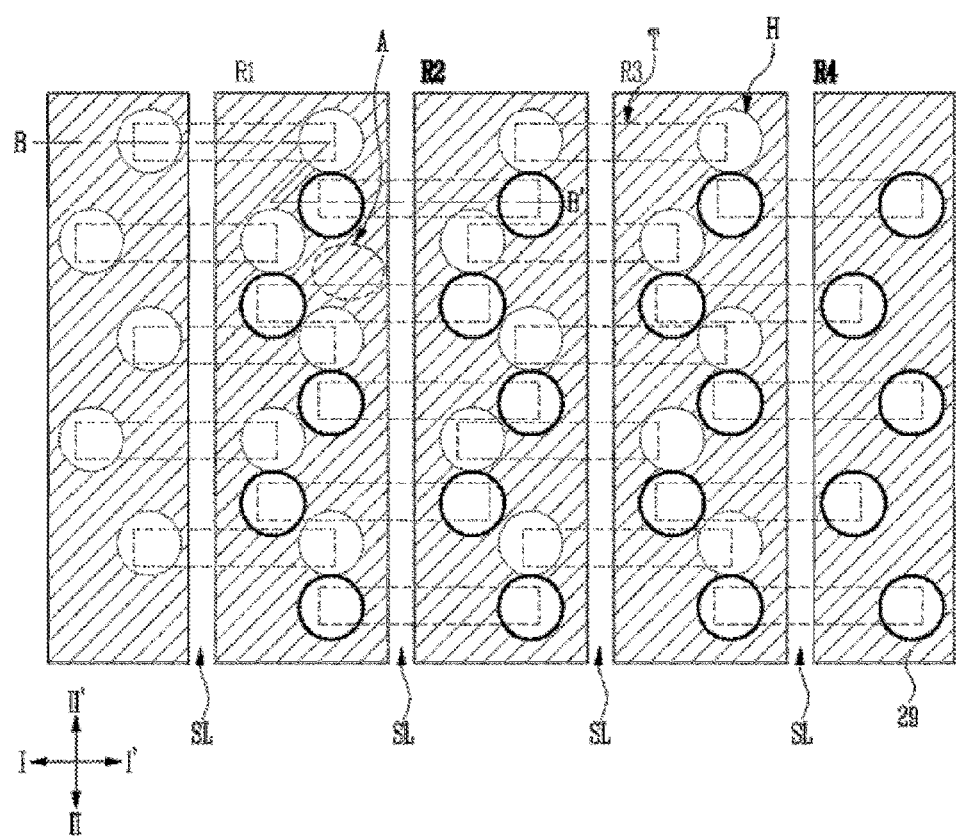

SEMICONDUCTOR DEVICE

CROSS-REFERENCE TO RELATED APPLICATION

The present application claims priority under 35 U.S.C 119(a) to Korean Application No. 10-2013-0113831, filed on Sep. 25, 2013, in the Korean Intellectual Property Office, which is incorporated herein by reference in its entirety as set forth in full.

BACKGROUND

1. Field of the Invention

The present invention relates to an electronic device. More specifically, the present invention relates to a semiconductor device with a plurality of memory cells stacked three-dimensionally.

2. Discussion of Related Art

A non-volatile memory element is a memory element that can get back stored data even when not powered. Recently, as the limit of enhancement of an integration degree of a two-dimensional memory element having memory cells formed on a silicon substrate in a single level is reached, a three-dimensional non-volatile memory element having memory cells stacked vertically on a silicon substrate has been proposed.

The three-dimensional non-volatile memory element includes interlayer insulating layers and word lines, which are alternately stacked, and channel layers, which pass therethrough. Memory cells are stacked along the channel layers. In the manufacturing process of the three-dimensional non-volatile memory element, the stacked word lines are formed by alternately stacking a plurality of oxide layers and a plurality of nitride layers and then replacing the plurality of nitride layers with a plurality of conductive layers.

However, the difficulty level of the process of replacing the plurality of nitride layers with the plurality of conductive layers is high. During the process of replacing the plurality of nitride layers with the plurality of conductive layers, other surrounding layers may be damaged, thereby degrading characteristics of the memory element.

SUMMARY

The present invention is directed to a semiconductor device having low manufacturing process difficulty and enhanced element characteristics.

One aspect of the present invention provides a semiconductor device including a plurality of pillar columns, each of the plurality of pillar columns including a plurality of pillars arranged in one direction to be offset from each other, wherein an mth pillar and an (m+1)th pillar, among the plurality of pillars included in each pillar column, are aligned with each other (m is an integer of 0 or more).

Another aspect of the present invention provides a semiconductor device including a plurality of channel columns, each of the channel columns comprising a plurality of channel layers arranged in one direction to be offset from each other, wherein each of the channel layers comprises a source side channel layer, a drain side channel layer, and a pipe channel layer connecting the source side channel layer and the drain side channel layer, and a first channel column and a second channel column overlap each other so that a first source side channel layer of the first channel column and a first source side channel layer of the second channel column are aligned with each other, and the second channel column and a third channel column overlap each other so that a first drain side channel layer of the second channel column and a first drain side channel layer of the third channel column are aligned with each other.

Still another aspect of the present invention provides a semiconductor device including a plurality of channel columns, each of the channel columns including channel layers arranged in one direction and aligned with each other, wherein the channel layers, included in each channel column, are divided into groups consisting of k channel columns (k is an integer of two or more), and the groups are spaced apart from each other, wherein each of the channel layers comprises a source side channel layer, a drain side channel layer, and a pipe channel layer connecting the source side channel layer and the drain side channel layer, and source side channel layers of a first channel column and source side channel layers of a second channel column are arranged to be offset from each other, and drain side channel layers of the second channel column and drain side channel layers of a third channel column are arranged to be offset from each other.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 1A to 1D are layout views of a semiconductor device according to an embodiment of the present invention;

FIGS. 5A to 7A and FIGS. 5B to 7B are views illustrating a method of manufacturing the semiconductor device according to an embodiment of the present invention;

DETAILED DESCRIPTION

Figure 1A:
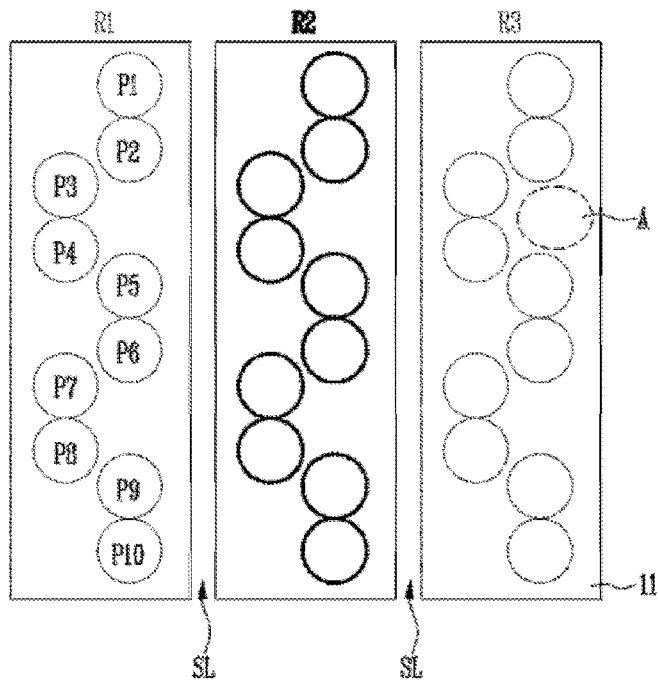

Hereinafter, description will be made according to a most preferred embodiment. In the drawings, thickness and spacing are represented for convenience of description, which may be exaggerated and shown, compared to an actual physical thickness. In the description of the present invention, a well-known element irrespective of the substance of the present invention will be omitted. It should be noted that when elements are numbered in each drawing, the same or similar elements are denoted by the same reference numerals even though they are depicted in different drawings.

FIGS. 1A to 1D are layout views of a semiconductor device according to an embodiment of the present invention. In FIGS. 1A to 1D, pillars and conductive layers are mainly shown while other elements are omitted.

As shown in FIGS. 1A to 1D, the semiconductor device according to an embodiment of the present invention includes a plurality of pillar columns R1 to R3. Each of the pillar columns R1 to R3 includes a plurality of pillars P1 to P11 arranged in one direction. Each of the pillars P1 to P11 may be a channel layer or vertical electrode layer of the semiconductor device including memory cells stacked three-dimensionally. In addition, the pillars P1 to P11 may have a variety of forms, such as a straight type, U type, W type, etc.

Most of the pillars P1 to P10 included in each of the pillar columns R1 to R3 are arranged to be offset from each other, but some are arranged to be aligned with each other. For example, pillars included in one pillar column may be arranged to be offset from each other and divided into groups consisting of x pillars. Here, x is an integer of two or more. Pillars included in one group are arranged to be offset from each other, and x means the number of pillars included in one group. In addition, "alignment" means that the pillars are arranged in one line to be aligned with each other.

Figure 1B:
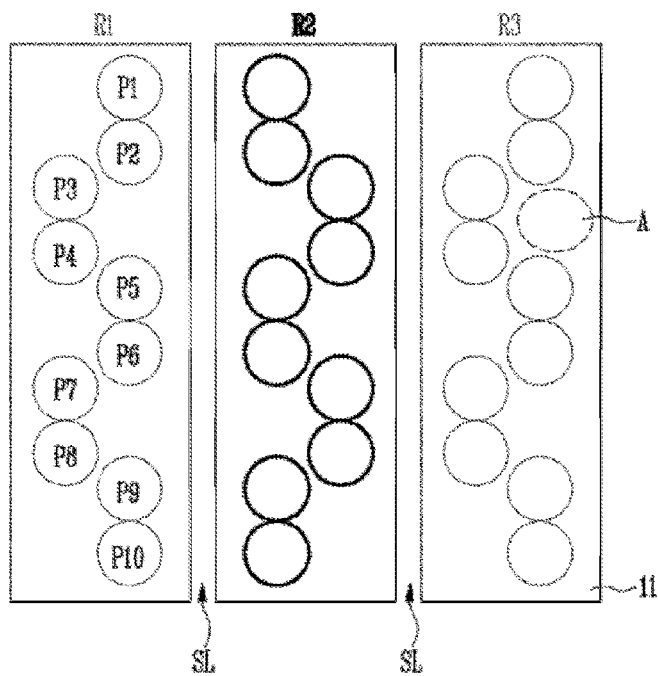

Referring to FIGS. 1A and 1B, the pillars P1 to P10 included in each of the pillar columns R1 to R3 are arranged in a zigzag form to be offset from each other and divided into groups consisting of two pillars. In this case, among the plurality of pillars P1 to P10 included in each of the pillar columns R1 to R3, an mth pillar and an (m+1)th pillar are arranged to be aligned with each other. Here, m=2k+1, and k is an integer of zero or more.

For example, the first pillar column R1 includes first to tenth pillars P1 to P10. Here, the second and third pillars P2 and P3 constitute one group, the fourth and fifth pillars P4 and P5 constitute one group, the sixth and seventh pillars P6 and P7 constitute one group, and the eighth and ninth pillars P8 and P9 constitute one group. In addition, the first pillar P1 and the second pillar P2 are aligned with each other, the second pillar P2 and the third pillar P3 are arranged to be offset from each other, and the third pillar P3 and the fourth pillar P4 are aligned with each other.

FIG. 1A illustrates a case where the adjacent pillar columns R1 to R3 are arranged in the same form, and FIG. 1B illustrates a case where the adjacent pillar columns R1 to R3 are arranged in a mirror type. Here, the first pillar column R1 and the second pillar column R2 have a bilateral symmetry structure, and the second pillar column R2 and the third pillar column R3 have a bilateral symmetry structure.

Referring to FIGS. 1C and 1D, the pillars P1 to P11 included in each of the pillar columns R1 to R3 are arranged in a zigzag form to be offset from each other, and divided into groups consisting of three pillars. In this case, among the plurality of pillars P1 to P11 included in each of the pillar columns R1 to R3, an mth pillar and an (m+1)th pillar are aligned with each other. Here, m=3k+1, and k is an integer of zero or more.

For example, the first pillar column R1 includes first to eleventh pillars P1 to P11. Here, the second to fourth pillars P2 to P4 constitute one group, the fifth to seventh pillars P5 to P7 constitute one group, and the eighth to tenth pillars P8 to P10 constitutes one group. Also, the second to fourth pillars P2 to P4 are arranged to be offset from each other, the fourth and fifth pillars P4 and P5 are aligned with each other, the fifth to seventh pillars P5 to P7 are arranged to be offset from each other, and the seventh and eighth pillars P7 and P8 are aligned with each other.

FIG. 1C illustrates a case where the adjacent pillar columns R1 to R3 are arranged in the same form, and FIG. 1D illustrates a case where the adjacent pillar columns R1 to R3 are arranged in a mirror type. Here, the first pillar column R1 and the second pillar column R2 have a bilateral symmetry structure, and the second pillar column R2 and the third pillar column R3 have a bilateral symmetry structure.

The semiconductor device may further include a plurality of insulating layers and a plurality of conductive layers 11, which are alternately stacked to surround the pillars P1 to P11. Here, the insulating layers and conductive layers 11 may have the same pattern. In addition, the conductive layers 11 may include a metal layer, such as tungsten, tungsten nitride, etc. and a barrier layer such as titanium nitride (TiN), tantalum nitride (TaN), etc.

For example, when the pillars P1 to P11 are straight type channel layers, the conductive layers 11 may include at least one lower selection gate, a plurality of control gates, and at least one upper selection gate, which are sequentially stacked. In addition, when the pillars P1 to P11 are U type or W type channel layers, the conductive layers may include a pipe gate, a plurality of control gates on the pipe gate, and selection gates on the control gates.

The semiconductor device may further include slits SL positioned between adjacent pillar columns R1 to R3. The slits SL may have a depth passing through the insulating layers and the conductive layers 11, which are alternately stacked. The slits SL may be formed at least partially between the pillar columns R1 to R3. Thus, each of the conductive layers 11 is formed to surround at least one pillar column.

In the present embodiment, a case where two consecutive pillars are aligned has been described. However, the number of aligned pillars is changeable. That is, two or more consecutive pillars may be aligned.

According to the above-described structure, the pillars P1 to P11 may be arranged to be offset from each other, thereby enhancing an integration degree of the semiconductor device. Also, some of the pillars P1 to P11, which are arranged to be offset, may be aligned with each other and thus a sufficient area A may be secured around the aligned pillars, thereby preventing or minimizing a void from being formed in the conductive layer 11. Accordingly, it is possible to increase a signal transfer speed and improve threshold voltage distribution in a programming or erasing operation, by reducing resistance of the conductive layer 11. Furthermore, it is possible to improve disturbance suppression and performance of the semiconductor device by reducing the number of pulses, which are used in the programming or erasing operation.

Figure 2:
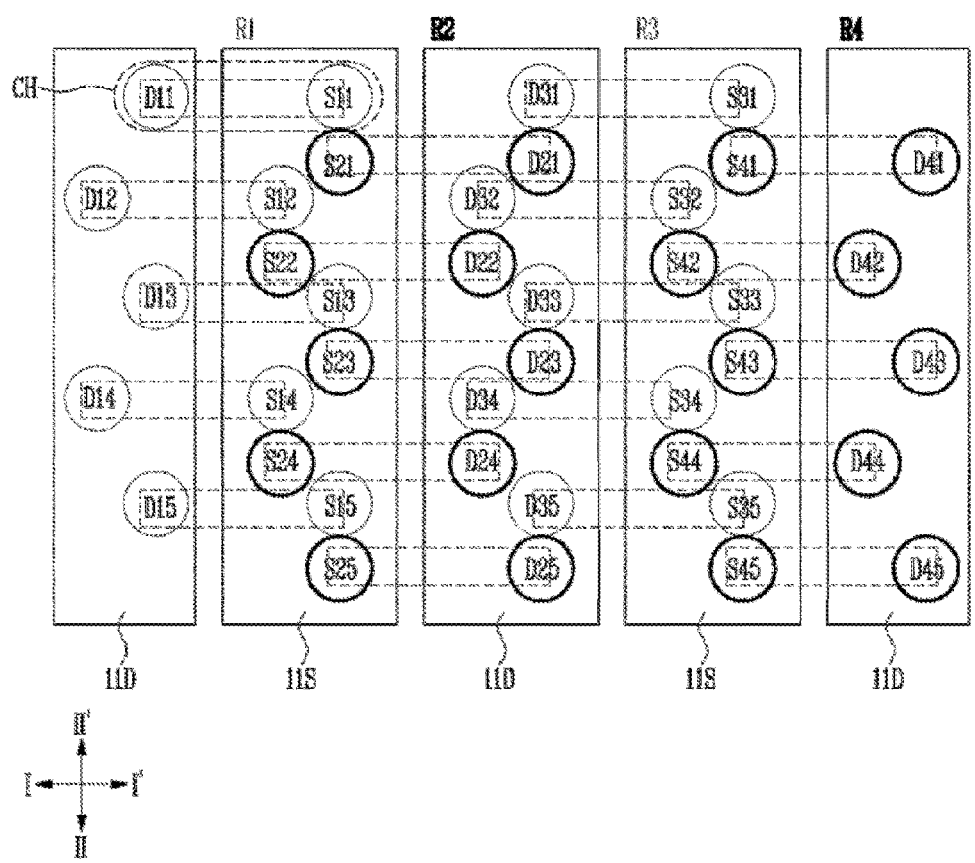
FIGS. 2 to 4 are layout views illustrating channel layer arrangement of the semiconductor device according to an embodiment of the present invention.
Figure 3:
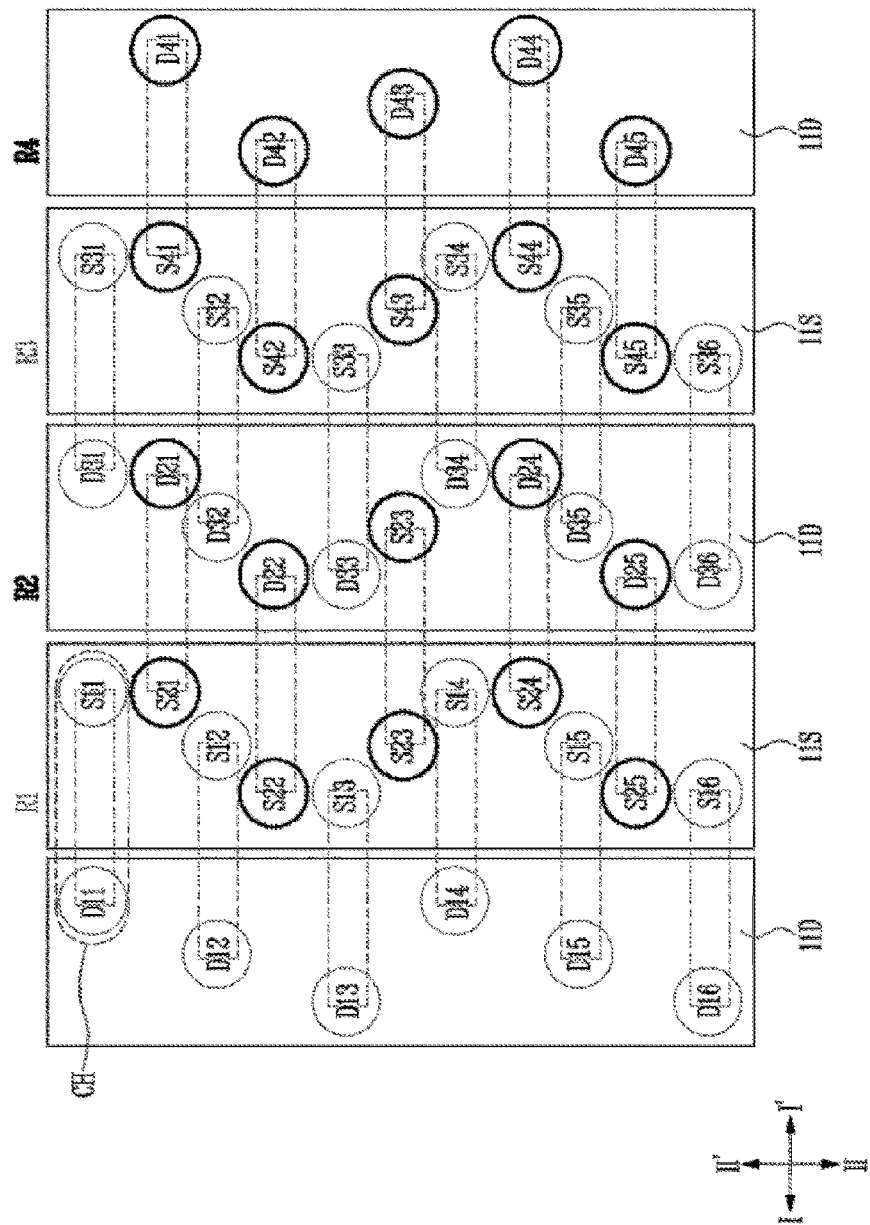
Figure 4:
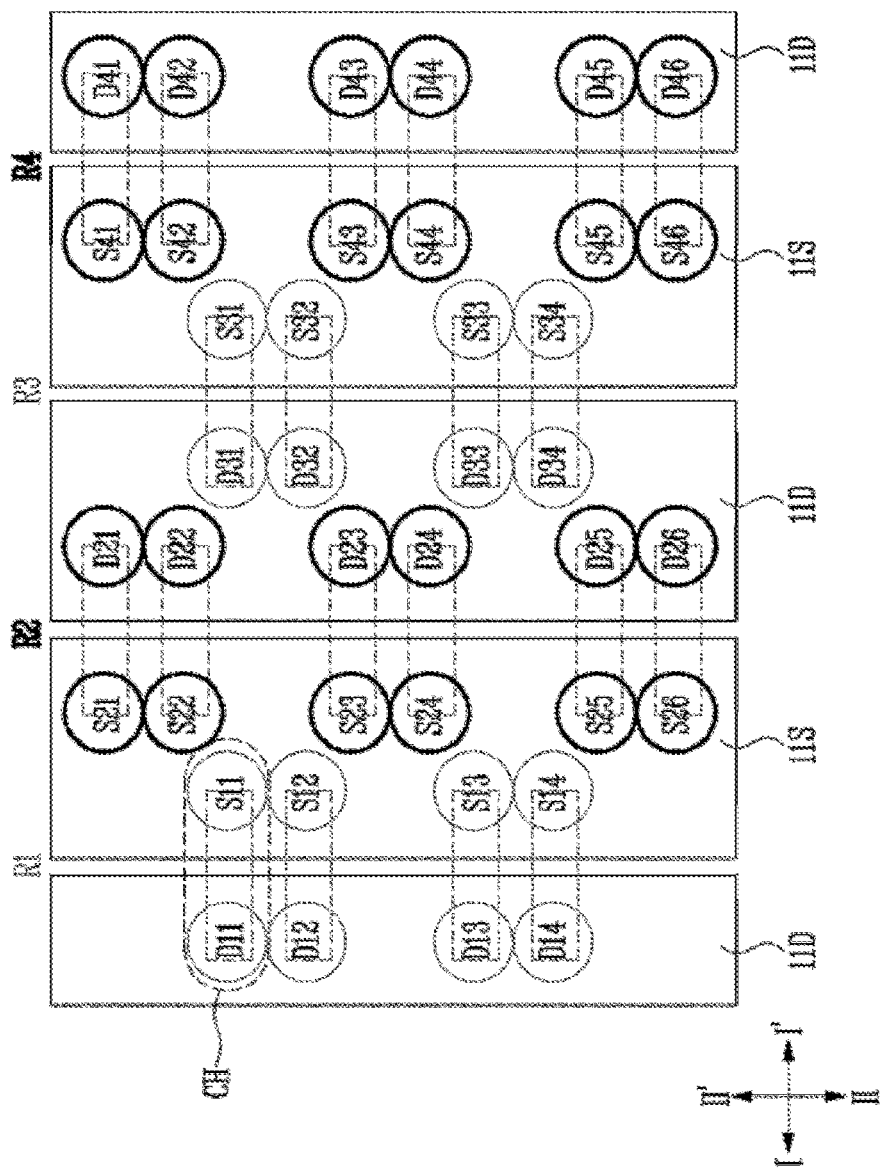

FIGS. 2 to 4 are layout views of a semiconductor device according to an embodiment of the present invention. In FIGS. 2 to 4, channel layers and conductive layers are mainly shown while other elements are omitted.

In the present embodiment, a case will be described where two pillars are connected by a connection pattern to form one U-shaped pattern. Here, the U-shaped pattern may be a channel layer CH. For example, the channel layer CH is formed as a semiconductor layer containing silicon. The channel layer CH includes source side channel layers S11 to S46, drain side channel layers D11 to D46, and a pipe channel layer (See dotted lines). Each of the source and drain side channel layers S11 to S46 and D11 to D46 may be a pillar having a cross section of a circle, an ellipse, a polygon, etc. In addition, the pipe channel layer is positioned on an upper or lower portion of the source and drain side channel layers S11 to S46 and D11 to D46 and configured to connect the source side channel layers S11 to S46 with the drain side channel layers D11 to D46.

A plurality of channel layers CH are arranged in a first direction (I-I') and a second direction (II-II') intersecting the first direction (I-I'). Here, channel layers CH arranged in the second direction (II-II') constitute one channel column R1 to R4.

For reference, a case where the U-shaped pattern is a channel layer has been described in the present embodiment. However, the U-shaped pattern may be a vertical electrode layer. In this case, all of pillars and connection patterns included in the U-shaped pattern are formed with a conductive layer.

A structure of the semiconductor device will be described below in detail with reference to respective drawings.

As shown in FIG. 2, the semiconductor device according to an embodiment of the present invention includes a plurality of channel layers CH. The channel layers CH included in each channel column R1 to R4 are arranged in a zigzag form to be offset from each other, and adjacent channel columns R1 to R4 are overlapped with each other.

Among the channel columns R1 to R4, an nth channel column and an (n+1)th channel column overlap each other such that mth source side channel layers are aligned with each other, and the (n+1)th channel column and an (n+2)th channel column are overlap each other such that mth drain side channel layers are aligned with each other. Here, m and n are each an integer of zero or more.

For example, a first source side channel layer S11 of the first channel column R1 and a first source side channel layer S21 of the second channel column R2 are aligned with each other, the first source side channel layer S21 of the second channel column R2 and a second source side channel layer S12 of the first channel column R1 are arranged to be offset from each other, and the second source side channel layer S12 of the first channel column R1 and a second source side channel layer S22 of the second channel column R2 are aligned with each other.

Also, a first drain side channel layer D21 of the second channel column R2 and a first drain side channel layer D31 of the third channel column R3 are aligned with each other, and a first source side channel layer S31 of the third channel column R3 and a first source side channel layer S41 of the fourth channel column R4 are aligned with each other.

The semiconductor device may further include insulating layers and conductive layers (11S and 11D), which are alternately stacked to surround the channel layers CH. The conductive layers 11S and 11D may include a plurality of source side conductive layers 11S stacked to surround source side channel layers of an nth channel column and source side channel layers of an (n+1)th channel column, and a plurality of drain side conductive layers 11D stacked to surround drain side channel layers of the (n+1)th channel column and drain side channel layers of an (n+2)th channel column. Here, n is an integer of zero or more. Additionally, the source side conductive layers 11S and the drain side conductive layers 11D may be alternately arranged.

The source and drain side conductive layers 11S and 11D may each include a metal layer such as tungsten, tungsten nitride, etc. In addition, the source and drain side conductive layers 11S and 11D may each include a barrier layer such as titanium nitride (TiN), tantalum nitride (TaN), etc.

The semiconductor device may further include a pipe gate surrounding a pipe channel layer. For example, the pipe gate is formed to surround pipe channel layers included in one memory block. In addition, the pipe gate may be positioned in a lower portion of each of the source and drain side conductive layers 11S and 11D.

According to this structure, source side channel layers S11 to S25 and S31 to S45 commonly connected to one source side conductive layer 11S are arranged in the second direction (II-II') to be offset from each other, and divided into groups consisting of two source side channel layers. Also, drain side channel layers D21 to D35 commonly connected to one drain side conductive layer 11D are arranged in the second direction (II-II') to be offset from each other, and divided into groups consisting of two drain side channel layers.

As shown in FIG. 3, the semiconductor device according to an embodiment of the present invention includes a plurality of channel layers CH. The channel layers CH included in each channel column R1 to R4 are arranged in a zigzag form to be offset from each other, and adjacent channel columns R1 to R4 are arranged to overlap each other.

Among the channel columns R1 to R4, the nth channel column and the (n+1)th channel column overlap each other such that the mth source side channel layers are aligned with each other, and the (n+1)th channel column and the (n+2)th channel column overlap each other such that the mth drain side channel layers are aligned with each other. Here, n and m are each an integer of zero or more.

For example, the first source side channel layer S11 of the first channel column R1 and the first source side channel layer S21 of the second channel column R2 are aligned with each other, the first source side channel layer S21 of the second channel column R2 and the second source side channel layer S12 of the first channel column R1 are arranged to be offset from each other, the second source side channel layer S12 of the first channel column R1 and the second source side channel layer S22 of the second channel column R2 are arranged to be offset from each other, and the second source side channel layer S22 of the second channel column R2 and a third source side channel layer S13 of the first channel column R1 are aligned with each other.

Also, the first drain side channel layer D21 of the second channel column R2 and the first drain side channel layer D31 of the third channel column R3 are aligned with each other, and the first source side channel layer S31 of the third channel column R3 and the first source side channel layer S41 of the fourth channel column R4 are aligned with each other.

The semiconductor device may further include insulating layers and the source side conductive layers 11S alternately stacked to surround the source side channel layers S11 to S45 and insulating layers and the drain side conductive layers 11D alternately stacked to surround the drain side channel layers D11 to D45. In addition, the semiconductor device may further include a pipe gate surrounding a pipe channel layer.

According to this structure, the source side channel layers S11 to S25 and S31 to S45 commonly connected to one source side conductive layer 11S are arranged in the second direction (II-II') to be offset from each other, and divided into groups consisting of three source side channel layers. Also, the drain side channel layers D21 to D36 commonly connected to one drain side conductive layer 11D are arranged in the second direction (II-II') to be offset from each other, and divided into groups consisting of three drain side channel layers.

As shown in FIG. 4, the semiconductor device according to an embodiment of the present invention includes a plurality of channel layers CH. The channel layers CH included in each channel column R1 to R4 are arranged in one line and aligned with each other. Here, the channel layers CH are divided into groups consisting of k channel layers CH, and the groups are spaced apart from each other. In addition, adjacent channel columns R1 to R4 are arranged not to overlap each other. Here, k is an integer of two or more. Channel layers CH included in one group are arranged to be adjacent to each other, and k means the number of channel layers CH included in one group.

Among the channel columns R1 to R4, the nth channel column and the (n+1)th channel column are arranged not to overlap such that source side channel layers are arranged to be offset from each other, and the (n+1)th channel column and the (n+2)th channel column are arranged not to overlap such that drain side channel layers are arranged to be offset from each other. Here, n is an integer of zero or more.

For example, first to fourth source side channel layers S11 to S14 of the first channel column R1 are aligned with each other. Here, first to fourth source side channel layers S11 to S14 are divided into groups consisting of two source side channel layers and the groups are spaced apart from each other. First to sixth source side channel layers S21 to S26 of the second channel column R2 are separated and aligned with each other. In addition, the first to fourth source side channel layers S11 to S14 of the first channel column R1 and the first to sixth source side channel layers S21 to S26 of the second channel column R2 are arranged to be offset from each other. Here, the first to fourth source side channel layers S11 to S14 included in the first channel column R1 are positioned between separated source side channel layers among the first to sixth source side channel layers S21 to S26 included in the second channel column R2. For example, the first and second source side channel layers S11 and S12 included in one group may be positioned between the second source side channel layer S22 and the third source side channel layer S23, and the third and fourth source side channel layers S13 and S14 included in one group may be positioned between the fourth source side channel layer S24 and the fifth source side channel layer S25.

Similarly, first to fourth drain side channel layers D31 to D34 of the third channel column R3 are aligned with each other. Here, first to fourth drain side channel layers D31 to D34 are divided into groups consisting of two drain side channel layers and the groups are spaced apart from each other. First to sixth drain side channel layers D21 to D26 of the second channel column R2 are aligned with each other. Here, First to sixth drain side channel layers D21 to D26 are divided into groups consisting of two drain side channel layers and the groups are spaced apart from each other. In addition, the first to fourth drain side channel layers D31 to D34 of the third channel column R3 and the first to sixth drain side channel layers D21 to D26 of the second channel column R2 are arranged to be offset from each other. Here, the first to fourth drain side channel layers D31 to D34 included in the third channel column R3 are positioned between separated drain side channel layers among the first to sixth drain side channel layers D21 to D26 included in the second channel column R2. For example, the first and second drain side channel layers D31 and D32 included in one group may be positioned between the second drain side channel layer D22 and the third drain side channel layer D23, and the third and fourth drain side channel layers D33 and D34 included in one group may be positioned between the fourth drain side channel layer D24 and the fifth drain side channel layer D25.

The semiconductor device may further include insulating layers and the source side conductive layers 11S alternately stacked to surround the source side channel layers S11 to S45 and insulating layers and the drain side conductive layers 11D alternately stacked to surround the drain side channel layers D11 to D45. In addition, the semiconductor device may further include a pipe gate surrounding a pipe channel layer.

According to this structure, the source side channel layers S11 to S26 and S31 to S46 commonly connected to one source side conductive layer 11S are arranged in the second direction (II-II') to be offset from each other, and divided into groups consisting of two source side channel layers. Also, the drain side channel layers D21 to D34 commonly connected to one drain side conductive layer 11D are arranged in the second direction (II-II') to be offset from each other, and divided into groups consisting of two drain side channel layers.

FIGS. 5A to 7A and FIGS. 5B to 7B are views illustrating a method of manufacturing the semiconductor device according to an embodiment of the present invention. FIGS. 5A to 7A are layout views, and FIGS. 5B to 7B are cross sectional views taken along line B-B'.

In the present embodiment, a method of manufacturing the semiconductor device having the layout as described with reference to FIG. 2 will be described. However, the semiconductor device having the layout as described with reference to FIG. 3 or 4 may be manufactured by applying the manufacturing method of the present embodiment.

Figure 5B:
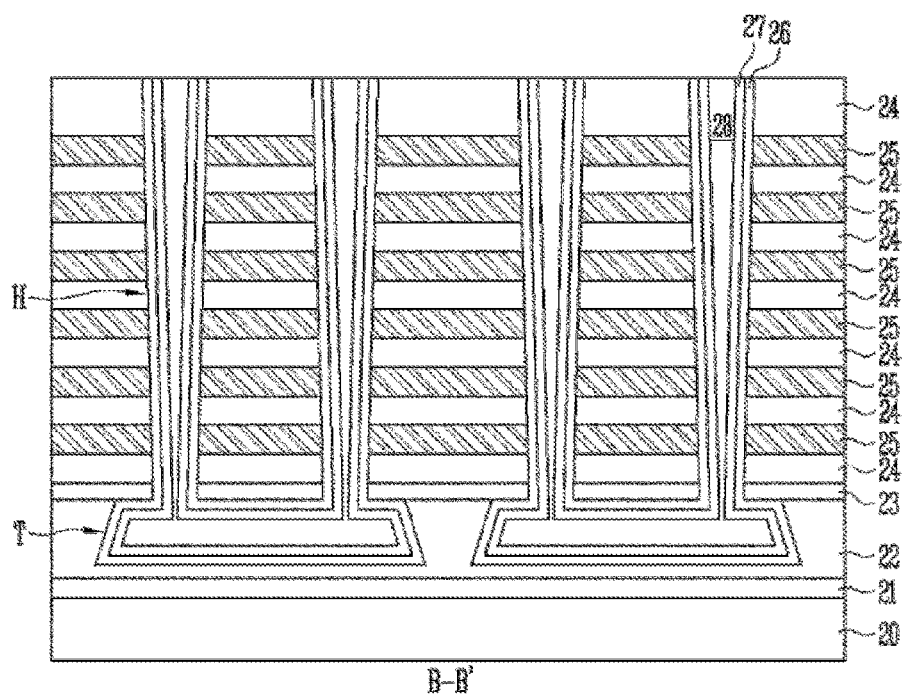

As shown in FIGS. 5A and 5B, an interlayer insulating layer 21 is formed on a substrate 20 and then a pipe gate conductive layer 22 is formed on the interlayer insulating layer 21. Subsequently, trenches T are formed in the conductive layer 22, and then sacrificial layers (not shown) are formed in the trenches T. Afterwards, a protective layer 23 may be further formed on the conductive layer 22 having the formed sacrificial layers. For example, the protective layer 23 is formed of a conductive material.

Here, the trenches T are arranged in the first direction (I-I') and the second direction (II-II'), and the trenches T arranged in the second direction (II-II') constitute one column R1 to R4. Most of the trenches T included in one column R1 to R4 are arranged to be offset from each other, but some are aligned with each other. For example, the trenches included in one column R1 to R4 may be arranged to be offset from each other and divided into groups consisting of x trenches.

Subsequently, a plurality of first material layers 25 and a plurality of second material layers 24 are alternately formed on the protective layer 23. Here, the first material layers 25 are formed of a material having a high etching selection ratio to the second material layer 24. For example, the first material layers 25 may be each formed as a sacrificial layer such as a nitride layer, and the second material layers 24 may be each formed as an insulating layer such as an oxide layer. Alternatively, the first material layers 25 may be each formed as a first sacrificial layer, and the second material layers 24 may be each formed as a second sacrificial layer. In the present embodiment, a case will be described where the first material layers 25 may be each formed as the sacrificial layer, and the second material layer 24 may be each formed as the insulating layer.

Subsequently, a plurality of holes H are formed to pass through the plurality of first and second material layers 24 and 25. The holes H are formed at a point for connecting to the trench T. For example, the plurality of holes H are formed such that a pair of holes H may be connected to one trench T.

Subsequently, the sacrificial layers exposed through the holes H are removed, and a channel layer 27 is formed in the trench T and holes H. Here, the channel layer 27 may include a pipe channel layer positioned in the trench T and source and drain side channel layers positioned in the holes H.

As an example, a memory layer 26 and the channel layer 27 are sequentially formed in the trench T and holes H. Here, the memory layer 26 may include at least one of a charge blocking layer, a data storage layer, and a tunnel insulating layer. For example, the data storage layer includes at least one of a floating gate such as a polysilicon layer for storing a charge, a charge trap layer such as a nitride layer for trapping a charge, and a nanodot. In addition, the channel layer 27 may be formed to have an open center region, a filled center region, or a combination thereof. An insulating layer 28 is formed in the open center region of the channel layer 27.

As another example, a gate insulating layer, a channel layer, and a phase-change material layer are sequentially formed in the trench T and holes H. Here, the phase-change material layer may be formed to have an open center region, a filled center region, or a combination thereof. An insulating layer is formed in the open center region of the phase-change material layer.

Figure 6A:
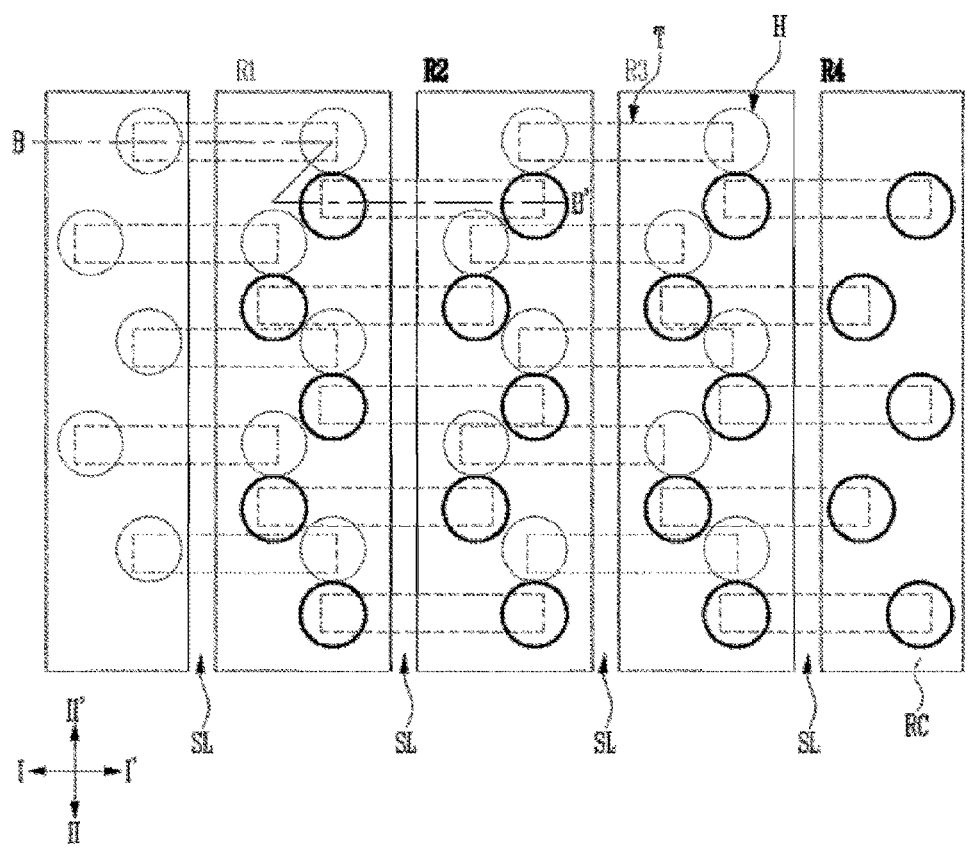
Figure 6B:
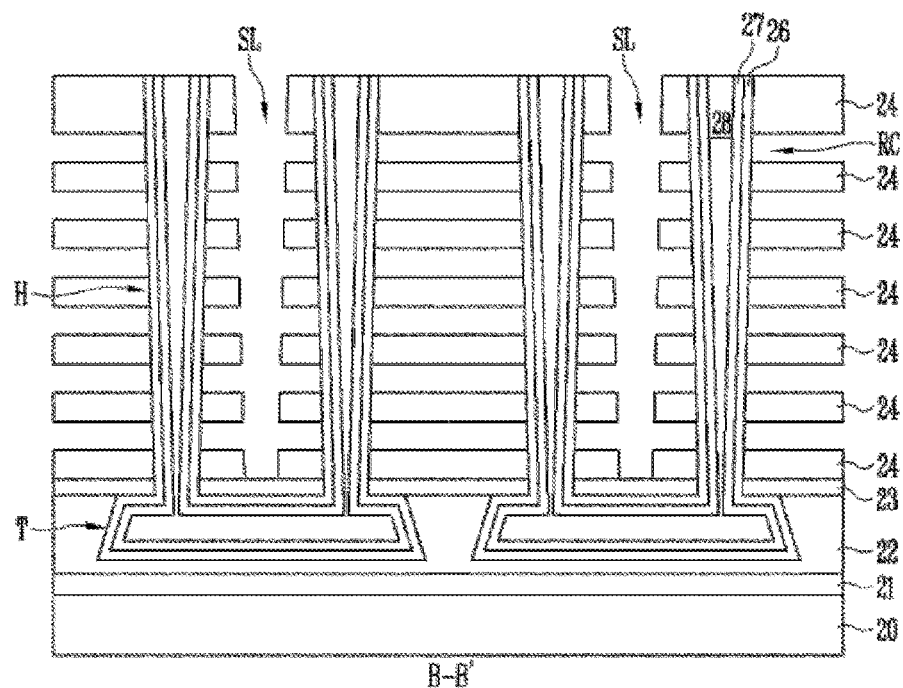

As shown in FIGS. 6A and 6B, a plurality of slits SL are formed to pass through the plurality of first and second material layers 25 and 24. Here, the slits SL are positioned between a source side channel layer and a drain side channel layer, which are connected by one pipe channel layer. In addition, the slits SL may be formed by an etching process using the protective layer 23 as an etching stopper. Subsequently, the first material layers 25 exposed in the slits SL are selectively removed to form recess regions RC.

Figure 7B:
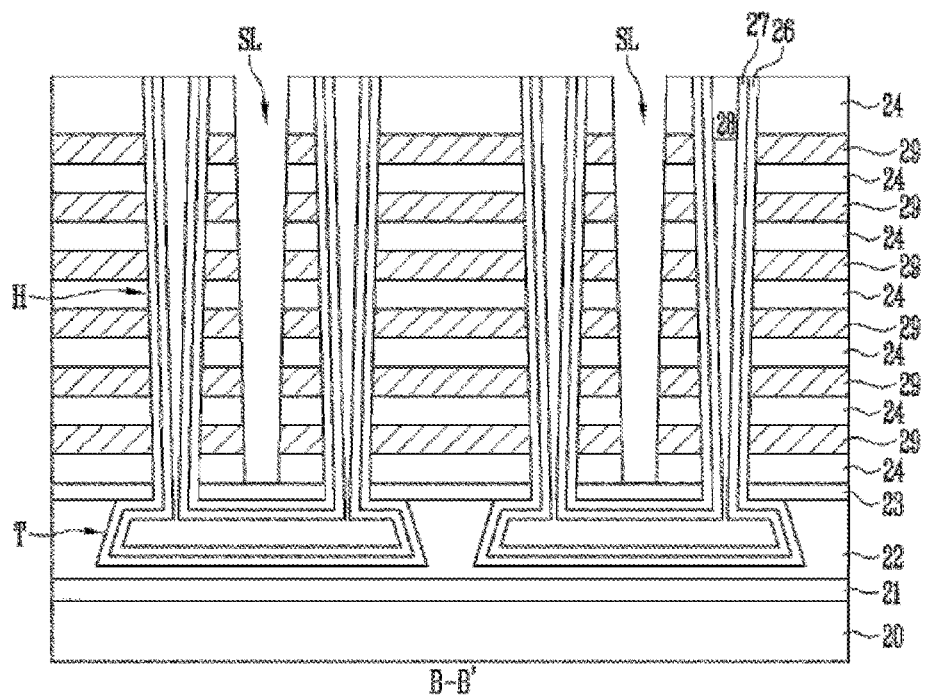

As shown in FIGS. 7A and 7B, conductive layers 29 are formed in the recess regions RC through the slits SL. In this case, since a space between pillars (source and drain side channel layers) is smaller as a region is more separated from the slits SL, the recess regions RC may not be completely filled with the conductive layers 29, but may have a vacant space. In this case, a reactive gas used to form the conductive layers 29 may remain in the vacant space, thereby damaging surrounding layers. However, according to an embodiment of the present invention, most of pillars (source and drain side channel layers) included in one pillar column are arranged to be offset from each other, but some are aligned with each other. That is, since the offset pillars (source and drain side channel layers) are divided into groups consisting of k pillars, a sufficient area A is secured between the pillars (source and drain side channel layers). Accordingly, it is possible to prevent a reactive gas from remaining therein and thus prevent damage of the surrounding layers.

For reference, though not shown in the drawings, memory layers may be further formed before forming the conductive layers 29. Here, the additionally formed memory layer may include at least one of a charge blocking layer, a data storage layer, and a tunnel insulating layer. For example, the data storage layer includes at least one of a floating gate such as a polysilicon layer for storing a charge, a charge trap layer such as a nitride layer for trapping a charge, and a nanodot.

Though not shown in the drawings, a barrier layer may be further formed before forming the conductive layers 29. Here, the barrier layer may include titanium nitride (TiN), tantalum nitride (TaN), etc.

Moreover, the above-described manufacturing method may be partially changed. For example, the first material layer 25 may be formed as the first sacrificial layer, and the second material layer 24 may be formed as the second sacrificial layer. In this case, additional recess regions are formed by removing the second material layers 24 exposed in the slits SL, before forming the recess regions RC or after forming the conductive layers 29. Furthermore, a process of etching the memory layer 26 exposed in the recess regions may be additionally carried out. In this case, it is possible to enhance data retention characteristics by separating data storage layers of the stacked memory cells from each other.

The present embodiment may be applied to a case where a pillar is in a straight type. In this case, a source region is formed on the substrate 20. Also, a process of forming the interlayer insulating layer 21, the pipe gate conductive layer 22, the trench T, etc. will be omitted.

Figure 8:
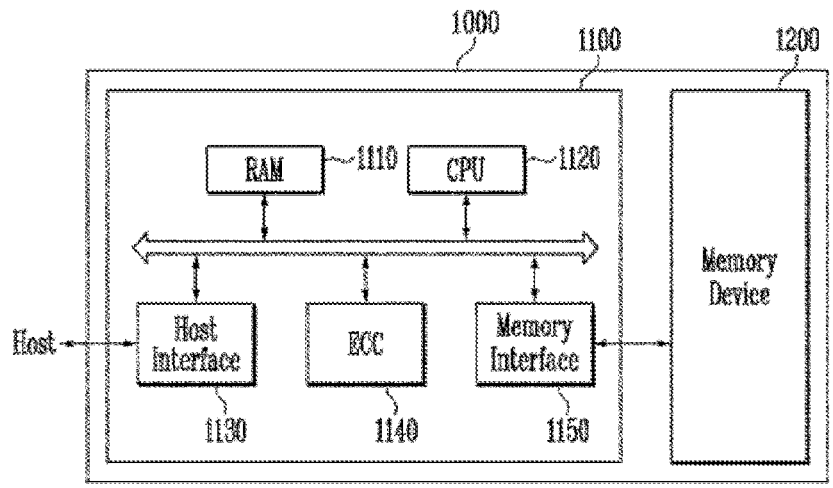
FIG. 8 is a block diagram showing a configuration of a memory system according to an embodiment of the present invention.

FIG. 8 is a block diagram showing a configuration of a memory system according to an embodiment of the present invention.

As shown in FIG. 8, a memory system 1000 according to an embodiment of the present invention includes a memory device 1200 and a controller 1100.

The memory device 1200 is used to store data information having a variety of data forms, such as a text, a graphic, a software code, etc. The memory device 1200 may be a nonvolatile memory, and a semiconductor device described with reference to FIGS. 1A to 7B. Also, the memory device 1200 includes pillar columns including a plurality of pillars arranged in one direction to be offset from each other, and among the plurality of pillars included in one pillar column, an mth pillar and an (m+1)th pillar are aligned with each other. Since a structure and a manufacturing method of the memory device 1200 are the same as described above, their detailed description will be omitted.

The controller 1100 is connected to a host and the memory device 1200 and configured to access the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and so on.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 is configured to control overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code.

The memory interface 1150 may be configured to interface with the memory device 1200. For example, the memory interface 1150 includes an NAND interface or NOR interface.

For reference, the controller 1100 may further include a buffer memory (not shown) for temporarily storing data. Here, the buffer memory may be used to temporarily store data transferred to the outside through the host interface 1130 or data transferred from the memory device 1200 through the memory interface 1150. The controller 1100 may further include a ROM that stores code data for interfacing with the host.

As such, the memory system 1000 according to an embodiment of the present invention may include the memory device 1200 with a simplified manufacturing method and an enhanced integration degree, thereby enhancing data storage capacity of the memory system 1000.

Figure 9:
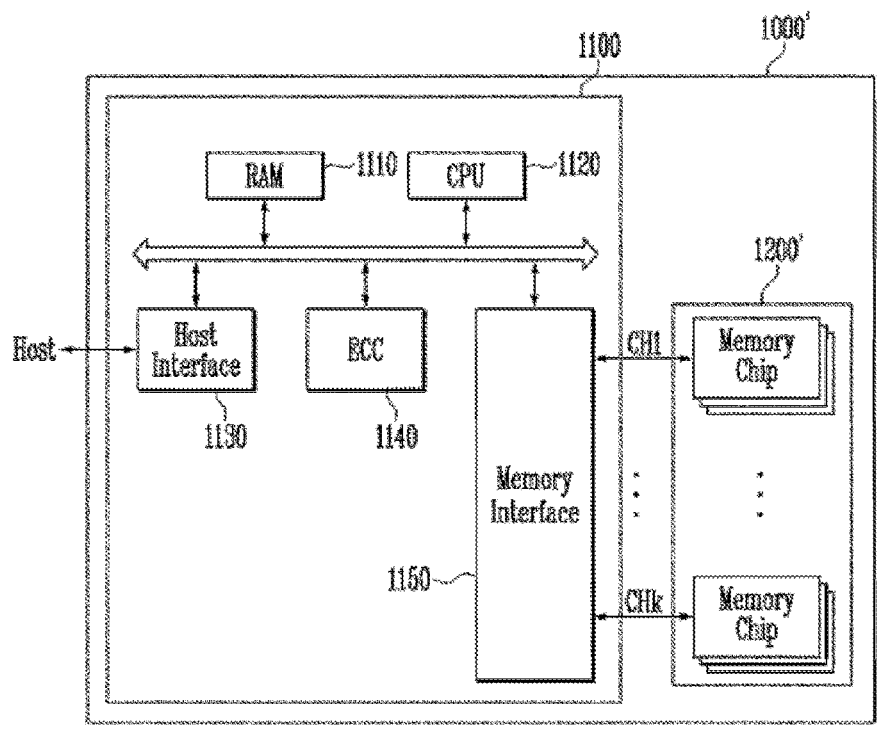
FIG. 9 is a block diagram showing a configuration of a memory system according to an embodiment of the present invention.

FIG. 9 is a block diagram showing a configuration of a memory system according to an embodiment of the present invention. Repetitive description associated with the elements described above will be omitted.

As shown in FIG. 9, a memory system 1000' according to an embodiment of the present invention includes a memory device 1200' and a controller 1100. In addition, the controller 1100 includes a RAM 1110, a CPU 1120, a host interface 1130, an ECC circuit 1140, a memory interface 1150, and so on.

The memory device 1200' may be a non-volatile memory, and a semiconductor device described with reference to FIGS. 1A to 7B. Also, the memory device 1200' includes pillar columns including a plurality of pillars arranged in one direction to be offset from each other, and among the plurality of pillars included in one pillar column, an mth pillar and an (m+1)th pillar are aligned with each other. Since a structure and a manufacturing method of the memory device 1200' are the same as described above, their detailed description will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As such, the memory system 1000' according to an embodiment of the present invention may include the memory device 1200' with a simplified manufacturing method and an enhanced integration degree, thereby enhancing data storage capacity of the memory system 1000'. Particularly, it is possible to further increase and enhance the data storage capacity and driving speed of the memory system 1000' by configuring the memory device 1200' as a multi-chip package.

Figure 10:
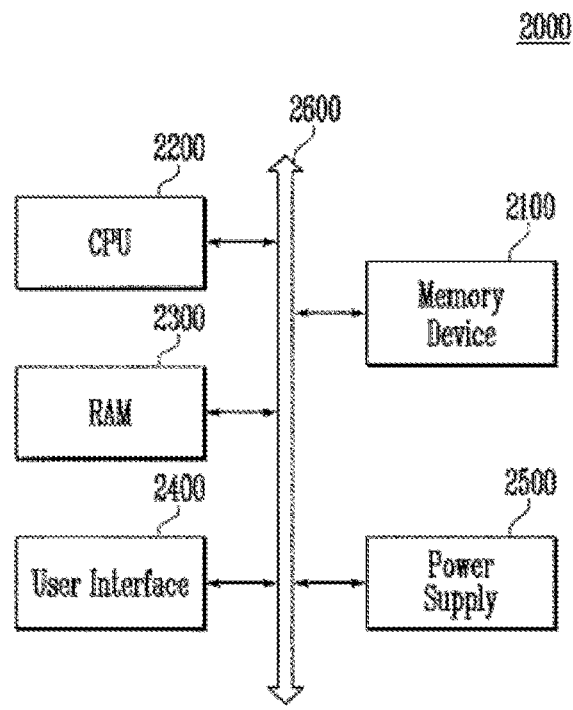
FIG. 10 is a block diagram showing a configuration of a computing system according to an embodiment of the present invention.

FIG. 10 is a block diagram showing a configuration of a computing system according to an embodiment of the present invention. Repetitive description associated with the elements described above will be omitted.

As shown in FIG. 10, a computing system 2000 according to an embodiment of the present invention includes a memory device 2100, a CPU 2200, a RAM 2300, a user interface 2400, a power source 2500, a system bus 2600, and so on.

The memory device 2100 stores data provided through the user interface 2400, data processed by the CPU 2200, and so on. In addition, the memory device 2100 is electrically connected to the CPU 2200, the RAM 2300, the user interface 2400, the power source 2500, and so on through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

Here, the memory device 2100 may be a non-volatile memory, and a semiconductor device described with reference to FIGS. 1A to 7B. Also, the memory device 2100 includes pillar columns including a plurality of pillars arranged in one direction to be offset from each other, and among the plurality of pillars included in one pillar column, an mth pillar and an (m+1)th pillar are aligned with each other. Since a structure and a manufacturing method of the memory device 2100 are the same as described above, their detailed description will be omitted.

The memory device 2100 may be a multi-chip package including a plurality of memory chips as described with reference to FIG. 9.

The computing system 2000 having this configuration may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As such, the computing system 2000 according to an embodiment of the present invention includes the memory device 2100 with a simplified manufacturing method and an enhanced integration degree, thereby enhancing data storage capacity of the computing system 2000.

Figure 11:
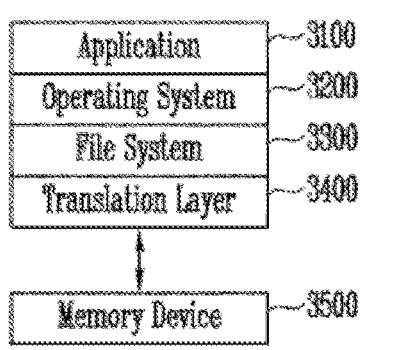
FIG. 11 is a block diagram showing a computing system according to an embodiment of the present invention.

FIG. 11 is a block diagram showing a computing system according to an embodiment of the present invention.

As shown in FIG. 11, a computing system 3000 according to an embodiment of the present invention includes a software layer including an operating system 3200, an application 3100, a file system 3300, a translation layer 3400, and so on. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3100.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3100, the application 3100, and the file system 3300 are shown as individual blocks. However, the application 3100 and the file system 3300 may be included in the operating system 3100.

The translation layer 3400 translates an address into a form suitable for the memory device 3500 in response to a request from the file system 3300. For example, the translation layer 3400 translates a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), etc.

The memory device 3500 may be a non-volatile memory, and a semiconductor device described with reference to FIGS. 1A to 7B. Also, the memory device 3500 includes pillar columns including a plurality of pillars arranged in one direction to be offset from each other, and among the plurality of pillars included in one pillar column, an mth pillar and an (m+1)th pillar are aligned with each other. Since a structure and a manufacturing method of the memory device 3500 are the same as described above, their detailed description will be omitted.

The computing system 3000 having this configuration may be divided into an operating system layer performed in an upper level region and a controller layer performed in a lower level region. Here, the application 3100, the operating system 3100, and the file system 3300 are included in the operating system layer, and may be driven by the operation memory of the computing system 3000. In addition, the translation layer 3400 may be included in the operating system layer or the controller layer.

As such, the computing system 3000 according to an embodiment of the present invention includes the memory device 3500 with a simplified manufacturing method and an enhanced degree of integration, thereby enhancing data storage capacity of the computing system 3000.

Each pillar column includes a plurality of pillars arranged in one direction to be offset from each other, and some of the plurality of pillars included in one pillar column are aligned with each other. By arranging the pillars as such, it is possible to enhance the integration degree. In addition, it is possible to lower the manufacturing process difficulty and prevent the damage of the adjacent layers to enhance elements characteristics.

The technical spirit of the present invention has been described in detail with reference to the preferred embodiments, but it should be noted that the foregoing embodiments are provided only for illustration while not limiting the present invention. Furthermore, it will be understood by those skilled in the art that various changes in form and detail may be made therein without departing from the technical spirit of the present invention.

What is claimed is:

1. A semiconductor device comprising:
a plurality of pillar columns, each of the plurality of pillar columns including a plurality of pillars arranged in one direction to be offset from each other,
wherein an mth pillar and an (m+1)th pillar, among the plurality of pillars included in each pillar column, are aligned with each other,
wherein m is an integer of 0 or more, and
wherein the (m+1)th pillar and an (m+2)th pillar included in one pillar column are arranged to be offset from each other and the (m+2)th pillar and an (m+3)th pillar are aligned with each other.

2. The semiconductor device of claim 1, further comprising a plurality of insulating layers and a plurality of conductive layers alternately stacked to surround the pillars.

3. The semiconductor device of claim 2, wherein the plurality of conductive layers each comprise tungsten.

4. The semiconductor of claim 2, wherein each of the conductive layers comprises at least one lower selection gate, a plurality of control gates, and at least one upper selection gate which are sequentially stacked.

5. The semiconductor of claim 2, wherein the conductive layers comprises a pipe gate, a plurality of control gates, and at least one selection gate, which are sequentially stacked.

6. The semiconductor device of claim 1, further comprising at least one slit positioned between the pillar columns adjacent to each other.

7. A semiconductor device comprising:
a plurality of channel columns, each of the channel columns including a plurality of channel layers arranged in one direction to be offset from each other,
wherein each of the channel layers comprises a source side channel layer, a drain side channel layer, and a pipe channel layer connecting the source side channel layer and the drain side channel layer,
wherein a first channel column and a second channel column overlap each other so that a first source side channel layer of the first channel column and a first source side channel layer of the second channel column are aligned with each other, and the second channel column and a third channel column overlap each other so that a first drain side channel layer of the second channel column and a first drain side channel layer of the third channel column are aligned with each other, and
wherein a first source side channel layer of the first channel column and a first source side channel layer of the second channel column are aligned with each other, the first source side channel layer of the second channel column and a second source side channel layer of the first channel column are arranged to be offset from each other, the second source side channel layer of the first channel column and a second source side channel layer of the second channel column are arranged to be offset from each other, and the second source side channel layer of the second channel column and a third source side channel layer of the first channel column are aligned with each other.

8. The semiconductor device of claim 7, further comprising:
a plurality of insulating layers and a plurality of source side conductive layers alternately stacked to surround source side channel layers of the first channel column and source side channel layers of the second channel column; and
a plurality of insulating layers and a plurality of drain side conductive layers alternately stacked to surround drain side channel layers of the second channel column and drain side channel layers of the third channel column.

9. The semiconductor device of claim 8, wherein the plurality of source side conductive layers and the plurality of drain side conductive layers each comprise tungsten.

10. The semiconductor device of claim 7, further comprising a pipe gate surrounding the pipe channel layers of the channel columns included in one memory block.

* * * * *

UNITED STATES PATENT AND TRADEMARK OFFICE
CERTIFICATE OF CORRECTION

PATENT NO. : 9,224,723 B2
APPLICATION NO. : 14/183092
DATED : February 18, 2014
INVENTOR(S) : Tae Kyung Kim et al.

Page 1 of 1

It is certified that error appears in the above-identified patent and that said Letters Patent is hereby corrected as shown below:

In the Claims:
Column 14, lines 23, cancel the text beginning with "a first source side" to and ending "each other," in line 25.

Signed and Sealed this
Twenty-third Day of August, 2016

Michelle K. Lee
*Director of the United States Patent and Trademark Office*